(12) United States Patent
Tabery et al.

(10) Patent No.: US 7,276,328 B1
(45) Date of Patent: Oct. 2, 2007

(54) LITHOGRAPHY MASK UTILIZING ASYMMETRIC LIGHT SOURCE

(75) Inventors: Cyrus E. Tabery, Santa Clara, CA (US); Bruno M. LaFontaine, Pleasanton, CA (US); Ivan Lavolic, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 718 days.

(21) Appl. No.: 10/791,259

(22) Filed: Mar. 2, 2004

(51) Int. Cl.
*G03F 7/20* (2006.01)

(52) U.S. Cl. ............... 430/395; 430/311; 430/322

(58) Field of Classification Search ............... 430/395, 430/311, 322
See application file for complete search history.

(56) References Cited

U.S. PATENT DOCUMENTS

| | | | |
|---|---|---|---|
| 5,989,776 A * | 11/1999 | Felter et al. ............ 430/270.1 |
| 6,195,201 B1 | 2/2001 | Koch et al. ............ 430/395 |
| 6,731,380 B2 * | 5/2004 | Amara et al. ............ 356/73 |
| 2002/0085276 A1 * | 7/2002 | Tanitsu et al. ............ 359/432 |
| 2004/0012775 A1 * | 1/2004 | Kinney et al. ............ 356/237.2 |
| 2005/0225752 A1 * | 10/2005 | Takai et al. ............ 356/237.1 |

* cited by examiner

*Primary Examiner*—Kathleen Duda
(74) *Attorney, Agent, or Firm*—Renner, Otto, Boisselle & Sklar, LLP

(57) ABSTRACT

A method of reflective lithography includes directing an asymmetric radiation (light) beam onto a reticle of a reflective lithography system. The asymmetry in the shape of the radiation beam may be used to compensate for a non-zero (non-normal) angle of incidence of the incident radiation. The radiation source shape may be configured to produce a substantially-symmetric output from the reticle. The shape of the radiation source may be configurable by any of a variety of suitable methods, for example by use of a configurable reflective device such as a fly's eye mirror, or by use of one or more suitable mirrors, lenses, and/or slits.

18 Claims, 3 Drawing Sheets

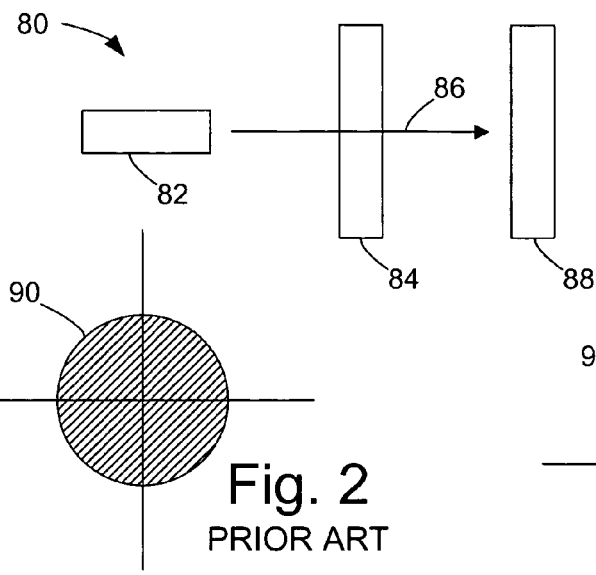
Fig. 1
PRIOR ART
Fig. 2
PRIOR ART
Fig. 3
PRIOR ART
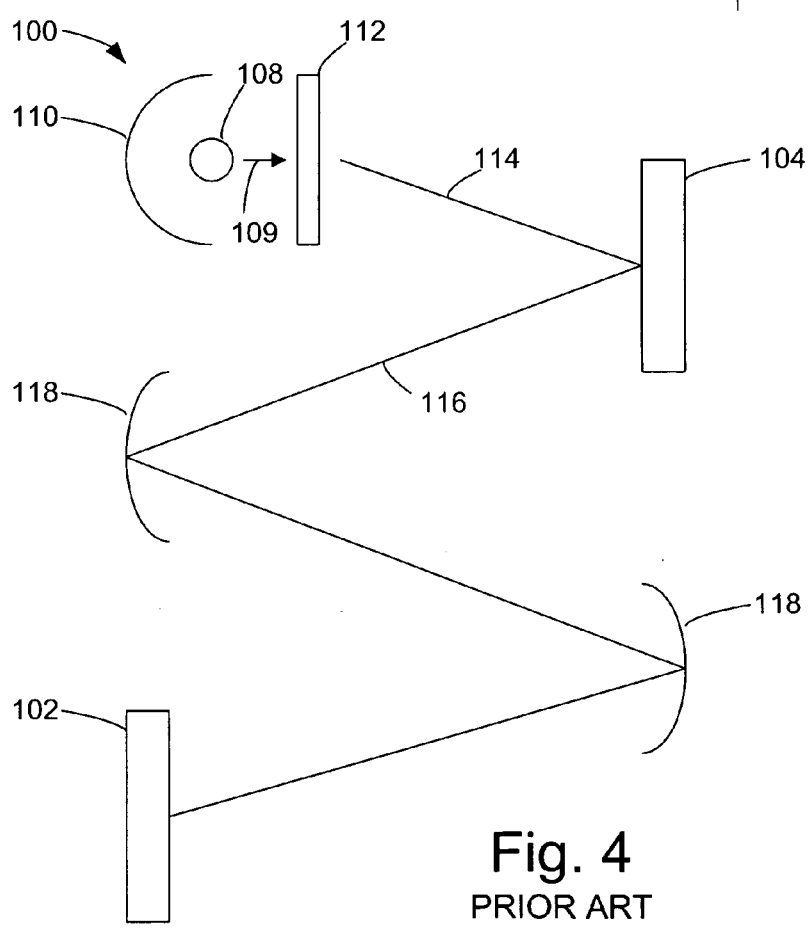
Fig. 4
PRIOR ART

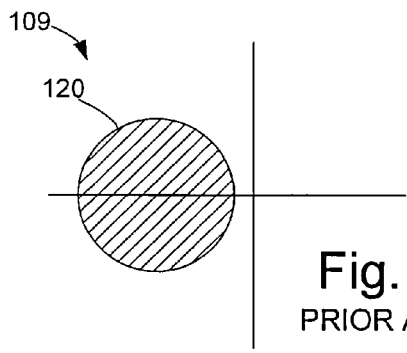
Fig. 5
PRIOR ART
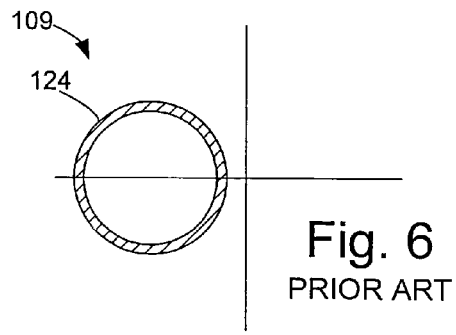
Fig. 6
PRIOR ART
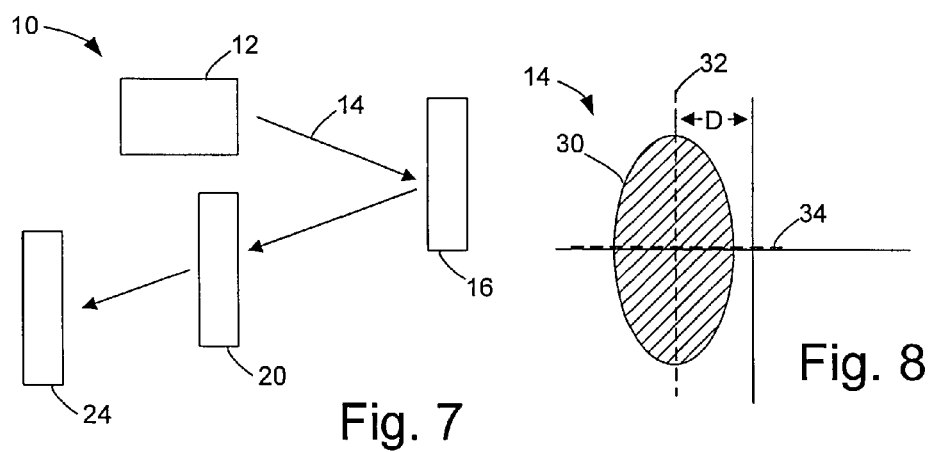
Fig. 7
Fig. 8
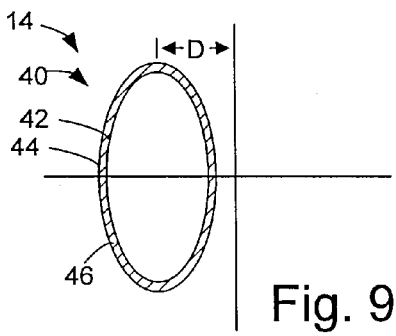
Fig. 9A
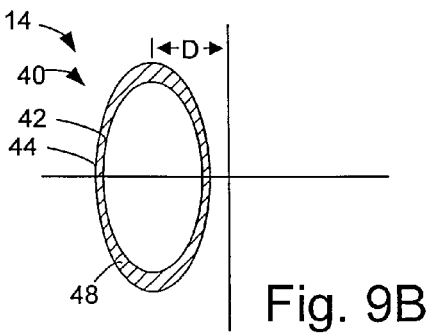
Fig. 9B

LITHOGRAPHY MASK UTILIZING ASYMMETRIC LIGHT SOURCE

BACKGROUND OF THE INVENTION

1. Field of the Invention

The invention relates generally to lithography methods for producing semiconductor devices.

2. Background of the Related Art

In the semiconductor field, there has been and continues to be a trend toward smaller devices and higher device densities. This trend shows no signs of abating in the future. Higher densities require the reducing of device sizes and/or distance between devices on semiconductor wafers. In addition, the overall size and/or spacing of interconnects between devices may also need to be reduced.

The trend towards higher device densities leads to a requirement for increased resolution in lithographic process, such as photolithographic processes. Generally speaking, lithography involves any of a variety of processes for transferring patterns between various types of media. With particular regard to semiconductor fabrication processes, a silicon or other semiconductor material may be coated with a resist material that is sensitive to a particular type of radiation. Such coating may be done, for example, by spin coating of the resist material onto the semiconductor wafer. After suitable preparation, a radiation source, such as a light source or source for other types of suitable radiation, may be used to expose selected areas of the resist to radiation. The exposure pattern may be transferred through an intervening mask or reticle, such that the pattern on the mask or reticle is transferred to the resist, either positively or negatively. Exposure to light or other radiation selectively changes the properties of the resist layer during the exposure process. This change in properties can be utilized to selectively expose portions of the underlying semiconductor substrate. For example, exposure may change the solubility of portions of the photoresist to a given solvent. The solvent may then be used to wash away either the exposed or unexposed portions of the photoresist (depending on the type of solvent and the change in solubility caused by exposure to suitable radiation). Thus, the pattern of the mask or reticle may be duplicated, either positively or negatively, in the resist on top of the semiconductor substrate. Suitable operations may be then carried out on the exposed portions of the substrate, such as doping or etching operations.

A prior-art pass-through lithographic system 80 schematically is illustrated in FIG. 1. The system 80 includes a light source 82, and a pass-though mask 84 for selectively passing light 86 to a target 88, which may for example be a resist-coated semiconductor device. The pattern from the mask 84 is thus transferred to the target 88. It will be appreciated that the system 80 may include additional elements.

The system 80 allows the light 86 to proceed in a direct line from the light source 82 to the target 88, with the light 86 passing through the mask 84 substantially normally incident to the mask 84. FIGS. 2 and 3 represent light from the source 82 in a two-dimensional frequency space, showing sine of an incident angle (relative to a direction normal to the mask 84) divided by numerical aperture, in both x- and y-directions. An ideal light source of infinitesimal extent would be a point at the origin. However, an actual source of some finite size involves some light that is at a non-zero angle of incidence (not exactly perpendicular). The shape of the light from the source may be a circle 90 centered about the origin (FIG. 2) or an annular shape 92 centered about the origin (FIG. 3).

However, with decreasing feature sizes, resolution requirements have increased to the point that optical systems may no longer be able to achieve the required resolution, due to limits inherently related to the wavelengths of optical light employed in such systems. One possibility of increasing resolution beyond the limits inherent to optical photolithography systems is to utilize shorter-wave length radiation. One specific possibility has been that the use of extreme ultraviolet (EUV) radiation, having wave lengths in the range of about 30 to 700 Angstroms (3-70 nm). Use of EUV radiation allows the possibility of achieving better resolution than in optical photolithography systems. A schematic diagram of a typical EUV lithography system is shown in FIG. 4. The system 100 shown in FIG. 4 generates an image onto a target 102, such as a semiconductor substrate coated with an appropriate resist, from a reflective mask or reticle 104. The transferred pattern may involve a pattern for fabrication directly onto the semiconductor substrate, such as by doping or etching. Alternatively, the pattern may involve other semiconductor fabrication operations, such as fabrication of interconnects on a suitable pattern, for example, to suitably connect together semiconductor devices on the substrate.

A radiation source 108, for example, being a partially-coherent laser source, generates suitable EUV radiation 109, for example, having a wavelength of about 3 nm to about 70 nm. A condenser 110 may aid in directing the EUV radiation in a desired direction. Optical filtering elements 112, such as lenses or other elements, may also be used in creating a beam of radiation of a suitable size, with a suitable intensity. One or more beams 114 of EUV radiation then impinge upon the reticle 104. The reflective 104 reflects portions of the beams 114, corresponding to the reflective pattern on the reticle 104. The reflective light corresponds to the desired pattern to be exposed on the resist of the target 102. The reflected portion 116 of the beams 114 may then pass through other optical elements, such as mirrors 118, eventually being directed to the target 102.

One difference between the system 100 shown in FIG. 4, and optical systems, is that prior optical systems have generally utilized a mask that selectively allows light to pass through, as shown in FIG. 1, rather than employing a reflective reticle, such as the reticle 104.

It will be appreciated that the system 100 shown in FIG. 4 is merely a schematic, showing some of the components of a reflective system for patterning using EUV radiation. Other suitable components, such as lenses, slits, or the like, may be utilized in such systems. The system 100 shown in FIG. 4 may be able to achieve a feature resolution better than that which may be had from optical photolithography systems. For example, the system 100 may achieve a feature resolution of 45 nm or less.

FIGS. 5 and 6 show two versions of frequency space diagram for radiation incident on a reticle of a reflective system such as the system 100 of FIG. 4. In each the incident radiation 109 (which may be referred to herein as "light," although it is not necessarily in the range of visible light) is offset from the origin, reflecting the fact that there must be some angle between the incident radiation and the outgoing radiation for a reflective system. Fully normal incident radiation would be reflected straight back toward its source. FIG. 5 shows an offset circle 120 of radiation, and FIG. 6 shows an offset annular shape 124 of radiation.

Although the general parameters of a reflective system for achieving high-resolution lithography have been set out, it will be appreciated that improvements are desirable in the design of a reflective mask, for example, in order to improve resolution and/or avoid unwanted effects in lithography.

SUMMARY OF THE INVENTION

According to an aspect of the invention, a method of selective exposure of a resist, includes the steps of: providing radiation having a cross-section shape that is asymmetric; reflecting the asymmetric radiation off a reflective reticle; and directing the asymmetric radiation to the resist.

According to another aspect of the invention, a lithography system includes an asymmetric radiation source; and a reflective reticle that receives asymmetric radiation from the asymmetric radiation source, and directs radiation toward a target to be selective exposed.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, which are not necessarily to scale:

FIG. 1 is a schematic diagram of a prior art pass-through lithography system;

FIG. 2 is a phase diagram of one configuration of radiation in the lithography system of FIG. 1;

FIG. 3 is a phase diagram of another configuration of radiation in the lithography system of FIG. 1;

FIG. 4 is a schematic diagram of a prior art reflective lithography system;

FIG. 5 is a phase diagram of one configuration of radiation in the lithography system of FIG. 4;

FIG. 6 is a phase diagram of another configuration of radiation in the lithography system of FIG. 4;

FIG. 7 is a schematic diagram of a lithography system in accordance with the present invention;

FIG. 8 is a phase diagram of one configuration of asymmetric radiation in the lithography system of FIG. 7;

FIG. 9A is a phase diagram of another configuration of asymmetric radiation in the lithography system of FIG. 7;

FIG. 9B is a phase diagram of yet another configuration of asymmetric radiation in the lithography system of FIG. 7;

DETAILED DESCRIPTION

Figure 10:
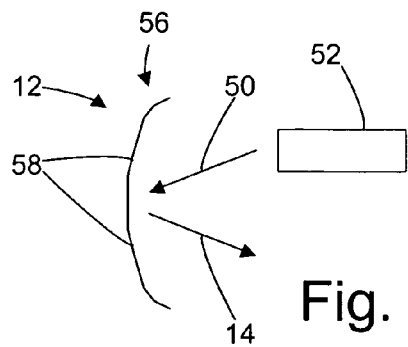
FIG. 10 is a schematic diagram of a first embodiment of the asymmetric radiation source of the lithography system of FIG. 7.

A method of reflective lithography includes directing an asymmetric radiation (light) beam onto a reticle of a reflective lithography system. The asymmetry in the shape of the radiation beam may be used to compensate for a non-zero (non-normal) angle of incidence of the incident radiation. The radiation source shape may be configured to produce a substantially-symmetric output from the reticle. The shape of the radiation source may be configurable by any of a variety of suitable methods, for example by use of a configurable reflective device such as a fly's eye mirror, or by use of one or more suitable mirrors, lenses, and/or slits.

Turning now to FIG. 7, a portion of a lithography system 10 is shown. The lithography system 10 includes an asymmetric radiation source 12 that directs asymmetric radiation 14 to a reflective reticle 16. The term "asymmetric," as used herein, refers to an asymmetric cross-section shape of radiation source, for example being wider in one dimension than in another direction. More particularly, the term "asymmetric" refers to non-axisymmetric cross-section shape in a plot of the angle of incidence of radiation (light) from the radiation source. The asymmetric radiation 14 has a non-axisymmetric cross-section shape, in contrast to the axisymmetric cross-section shapes shown in FIGS. 2, 3, 5, and 6. Put another way, the asymmetric radiation source may provide a range of angles of incident that is larger in a first direction than in a second direction that is orthogonal to the first direction. Note that radiation with an asymmetric cross-section, as used herein, may have some degree of symmetry, such as left-right symmetry or top-bottom symmetry. The system 10 may also include one or more optical elements 20 that direct radiation 22 emerging from the reticle 16 to a target 24, such a resist-coated wafer.

Examples of phase diagrams for the asymmetric radiation 14 are shown in FIGS. 8, 9A, and 9B. In all of the phase diagrams the asymmetric radiation 14 has a greater range of angle incidence in a first direction (the y-direction) than in a second direction that is perpendicular to the first direction (the x-direction). The ratio of the overall range of the angle incidence may be greater than 1, and may be greater than 10 or even a large number. The ratio may be between 1 and about 2. For example, the ratio may be between 1 and about 1.1, or may be between about 1.5 and 2.

In the phase diagrams, the radiation 14 may be offset form the origin a distance D in the first direction. This corresponds to a non-perpendicular average angle of incidence of the radiation 14 on the reticle 16. The average angle of incidence may be between about 2 degrees and about 8 degrees. More particularly, the average angle of incidence may be about 6 degrees.

FIG. 8 shows the radiation 14 having an elliptical shape 30. The ellipse 30 has a major axis 32 (shown in the y-direction) that is longer than its minor axis 34 (in the x-direction). Thus the range of angle of incidence is greater in the y-direction than the x-direction. This may allow compensation for the offset involved in the angled (non-perpendicular) incidence and reflection of the radiation 14 on the reflective reticle 16 and/or on the other optical elements 20 of the lithography system 10.

FIGS. 9A and 9B shows the radiation 14 having an elliptical ring shape 40. The elliptical ring shape 40 is defined on opposite sides by an inner ellipse 42 and by an outer ellipse 44. As shown in FIG. 9A, the ellipses 42 and 44 may be substantially parallel to one another. Thus the ring 40 may have a substantially uniform ring width 46, thus having a substantially equal range of angles of incidence for any given direction (angle from center of the ring 40) in phase space. Alternatively, as shown in FIG. 9B, the ellipses 42 and 44 may be non-parallel, giving a non-uniform ring width 48.

By use of the asymmetric radiation 14, with profiles such as those illustrated in FIGS. 8 and 9, compensation may be made for bias due to non-perpendicular angles of incidence onto the reflective reticle 16. The compensation for the bias may be made without a need to change the configuration of the reticle 16. Different angles of incident may be compensated for by changing the characteristics of the asymmetric radiation 14, for example by changing the relative range of angles of incidence in perpendicular directions.

FIGS. 10-13 show various embodiments of the asymmetric radiation source 12 that convert symmetric radiation 50 from a symmetric radiation source 52 to the asymmetric radiation 14. The symmetric radiation source 12 may be any of a variety of suitable sources of non-coherent radiation of a suitable wavelength, such as, for example, a suitable non-coherent laser source.

FIG. 10 illustrates conversion of the symmetric radiation 50 to the asymmetric radiation 14 by use of a fly's eye mirror 56. The fly's eye mirror 56 has a plurality of separately movable elements or facets 58 that may be individually tilted or controlled to achieve a desired orientation. Further details regarding fly's eyes mirrors may be found in U.S. Pat. No. 6,195,201. The fly's eye mirror 56 may be oriented to as to achieve the desired cross-section shape of the asymmetric radiation 14.

It will be appreciated that the fly's eye mirror 56 may be reconfigured as desired in order to change the shape or other characteristics of the asymmetric radiation 14. For example, the fly's eye mirror 56 may be re-configured when the angle of incidence of the asymmetric radiation 14 onto the reflective reticle 16 is changed.

Figure 11:
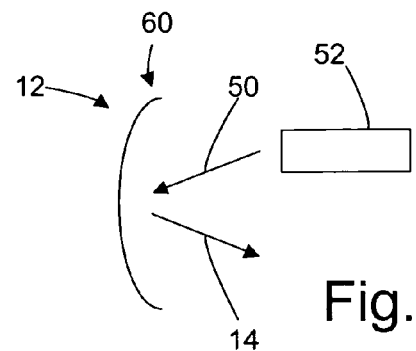
FIG. 11 is a schematic diagram of a second embodiment of the asymmetric radiation source of the lithography system of FIG. 7.

Turning now to FIG. 11, a fixed mirror 60 of desired shape may be used to achieve the desired asymmetry in the radiation 14. The fixed mirror 60 may have a different curvature in one direction than in a perpendicular direction, thereby producing the asymmetric radiation 14. It will be appreciated that other suitable well-known shapes for the fixed mirror 60 may be used to achieve the desired asymmetric radiation 14.

Figure 12:
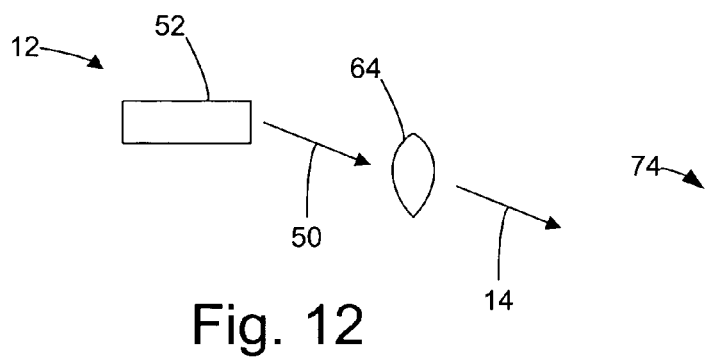
FIG. 12 is a schematic diagram of a third embodiment of the asymmetric radiation source of the lithography system of FIG. 7.

FIG. 12 shows another device, a lens 64, for transforming symmetric radiation to the asymmetric radiation 14. The lens 64 may have different optical characteristics to achieve the desired asymmetry in the asymmetric radiation 14. For example, one or both of the surfaces of the lens 64 may have different radii of curvature in different directions. It will be appreciated that the lens 64 may be embodied in different optical elements, such as multiple lenses. In addition, the lens 64 may be combined with other sorts of optical elements.

Figure 13:
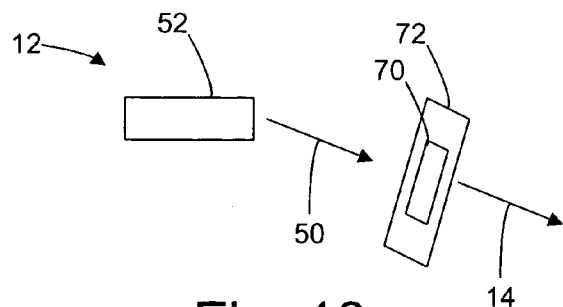
FIG. 13 is a schematic diagram of a fourth embodiment of the asymmetric radiation source of the lithography system of FIG. 7.

With reference now to FIG. 13, a slit 70 may be used to convert the symmetric radiation 50 to the asymmetric radiation 14. The slit 70 is in an object 72, such as a plate. The slit 70 has an asymmetric shape, asymmetrically blocking part of the incident symmetric radiation 70. The slit 70 may have any of a variety of suitable shapes, such as rectangular or elliptical.

Figure 14:
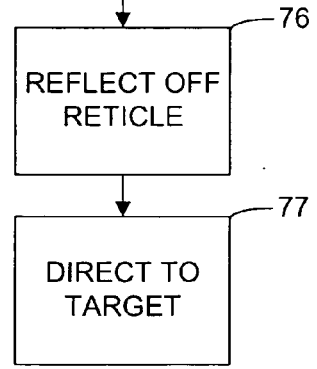
FIG. 14 is a high-level flow chart of a lithography method in accordance with the present invention.

Turning now to FIG. 14, a lithography or selective exposure method 74 includes: in step 75, providing radiation having a cross-section shape that is asymmetric; in step 76, reflecting the asymmetric radiation off a reflective reticle; and, in step 77 directing the asymmetric radiation to the target. The asymmetry in the asymmetric radiation may be varied as the average angle of incidence of the radiation on the reticle is varied. The asymmetry in the asymmetric radiation may substantially compensate for the bias that would otherwise occur because of the non-perpendicular incidence of the radiation reflecting off the reticle.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of selective exposure of a resist, comprising:
   providing radiation having a cross-section shape that is asymmetric;
   reflecting the asymmetric radiation off a reflective reticle; and
   directing the asymmetric radiation to the resist.

2. The method of claim 1, wherein the providing includes providing asymmetric radiation that has a greater range of angle incidence in a first direction than in a second direction that is perpendicular to the first direction.

3. The method of claim 2, wherein the ratio of the range of the angle incidence between the first direction and the second direction is greater than 1.

4. The method of claim 1, wherein the providing includes providing asymmetric radiation that has an elliptical shape in phase space.

5. The method of claim 1, wherein the providing includes providing asymmetric radiation that has an elliptical ring shape in phase space.

6. The method of claim 5, wherein the elliptical ring shape has a substantially uniform ring width.

7. The method of claim 5, wherein the elliptical ring shape has a non-uniform ring width.

8. The method of claim 1, wherein the providing includes transforming symmetric radiation to the asymmetric radiation.

9. The method of claim 8, wherein the transforming includes reflecting the symmetric radiation off a mirror to produce the asymmetric radiation.

10. The method of claim 9, wherein the reflecting off the mirror includes reflecting off a fly's eye mirror having a plurality of facets.

11. The method of claim 9, wherein the reflecting off the mirror includes reflecting off a fixed mirror.

12. The method of claim 8, wherein the transforming includes passing the radiation through one or more lenses to produce the asymmetric radiation.

13. The method of claim 8, wherein the transforming includes passing the symmetric radiation through one or more slits to produce the asymmetric radiation.

14. The method of claim 8, wherein the symmetric radiation includes non-coherent radiation from a laser source.

15. The method of claim 1,
wherein the reflecting off the reticle includes reflecting the asymmetric radiation at an average angle of incidence relative to the reticle, and
wherein asymmetry in the asymmetric radiation substantially compensates for bias in pattern transfer from the reticle to the resist due to the average angle of incidence.

16. The method of claim 15, wherein the providing includes changing the asymmetry of the asymmetric radiation in response to changes in the average angle of incidence.

17. The method of claim 15, wherein the average angle of incidence is between about 2 degrees and about 8 degrees.

18. The method of claim 1, wherein the asymmetric radiation includes extreme ultraviolet radiation having a wavelength between about 3 nm and about 70 nm.

* * * * *